United States Patent
Tsai et al.

(10) Patent No.: US 6,376,394 B1
(45) Date of Patent: Apr. 23, 2002

(54) METHOD OF FORMING INTER-METAL DIELECTRIC LAYER

(75) Inventors: Cheng-Yuan Tsai, Yunlin Hsien; Chih-Chien Liu, Taipei; Ming-Sheng Yang, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/617,458

(22) Filed: Jul. 17, 2000

(30) Foreign Application Priority Data

Mar. 31, 2000 (TW) .......................... 89106031 A

(51) Int. Cl.⁷ .......................... H01L 21/01; H01L 21/44
(52) U.S. Cl. .................. 438/783; 438/784; 438/787; 438/597
(58) Field of Search ................ 438/787, 597, 438/624, 435, 437, 633, 680, 778, 783, 784; 257/759, 346

(56) References Cited

U.S. PATENT DOCUMENTS

| | | | | |
|---|---|---|---|---|
| 6,001,746 A | * | 12/1999 | Tsai et al. ................ | 438/788 |
| 6,077,784 A | * | 6/2000 | Wu et al. ................. | 438/691 |
| 6,159,872 A | * | 12/2000 | Essaian et al. ............ | 438/787 |
| 6,177,329 B1 | * | 1/2001 | Pang ....................... | 438/400 |
| 6,180,540 B1 | * | 1/2001 | Jang ........................ | 438/784 |
| 6,187,683 B1 | * | 2/2001 | De Santi et al. ........... | 438/697 |
| 6,191,046 B1 | * | 2/2001 | Singh et al. ............... | 438/723 |
| 6,200,653 B1 | * | 3/2001 | Tsai et al. ................. | 427/579 |
| 6,218,284 B1 | * | 4/2001 | Liu et al. .................. | 438/624 |
| 6,228,780 B1 | * | 5/2001 | Kuo et al. ................. | 438/763 |

* cited by examiner

Primary Examiner—Michael S. Lebentritt
(74) Attorney, Agent, or Firm—J.C. Patents

(57) ABSTRACT

A fabrication method for an inter-metal dielectric layer is applicable to multi-level interconnects. A substrate is provided with metal lines formed thereon. A first (fluorinated silicon glass) FSG layer with low fluorine content is then formed on the substrate, followed by forming a biased-clamped FSG layer on the first FSG layer. A second FSG layer with low fluorine content is formed on the biased-clamped layer, prior to forming an oxide cap layer on the second FSG layer. The oxide cap layer is planarized until the oxide cap layer is level with the second FSG layer.

19 Claims, 3 Drawing Sheets

METHOD OF FORMING INTER-METAL DIELECTRIC LAYER

CROSS-REFERENCE TO RELATED APPLICATION

This application claims the priority benefit of Taiwan application serial no. 89106031, filed Mar. 13, 2000.

BACKGROUND OF THE INVENTION

1. Field of Invention

The present invention relates to fabrication method for a semiconductor device. Particularly, the invention relates to a method of fabricating an inter-metal dielectric (IMD) layer that is applicable to multilevel interconnects.

2. Description of Related Art

In an integrated circuit with two or more levels of interconnects, an inter-metal dielectric (IMD) layer must be placed between the levels for an isolation purpose. Generally, this dielectric layer needs to satisfy the following: its good film's reliability and mechanical stability, low water absorption, and ease for integration, etc. A typical material for the IMD layer includes silicon oxide that has a dielectric constant of about 4. Alternatively, fluorinated silicate glass (FSG) is used to make the IMD layer, for the reason that FSG has a lower dielectric constant of about 3.5 as compared to undoped silicate glass (USG). With a lower dielectric constant, it is desirable for the IMD layer to reduce the RC time delay of the interconnect metallization. Thus, in terms of process simplicity and integrity, FSG is a better choice among other lower dielectric constant materials for making a low dielectric layer.

FIG. 1A and FIG. 1B are schematic, cross-sectional diagrams illustrating a conventional fabrication method for an IMD layer. Referring to FIG. 1A, a plurality of metal lines 102 are formed on a substrate 100. A gap-filled FSG layer 106 with turning on bias power and clamped the wafer by electrostatic chuck (ESC) is formed on the substrate 100 by high-density plasma chemical vapor deposition (HDPCVD), and it fills the gap between the metal lines 102. Prior to the gap-fill FSG layer, an USG 104 normally is introduced, preventing the metal line from being attacked by fluorine. Then, a cap layer 108 is formed on the gap-fill FSG layer 106, wherein the cap layer 108 is made of oxide by plasma enhanced chemical vapor deposition (PECVD). A chemical mechanical polishing (CMP) process is subsequently performed to planarize the cap layer 108, as shown in FIG. 1B.

On the substrate 100, the metal lines 102 are usually distributed in a conductive line region both with dense and loose areas, respectively. As a result, a large step height difference exists between the gap-fill FSG layer 106 on the dense conductive line region 102a and that on the loose conductive line region 102b, after the biased-clamped FSG layer 106 and the cap layer 108 being formed. Thus, it is difficult to control a polishing stop for chemical mechanical polishing (CMP), and over-polishing easily arises. As a result, the gap-fill FSG layer 106 may be exposed, probably resulting in the instability of fluorine. Intrinsically, the gap-fill FSG layer exhibits a chemically or physically hydrophilic behavior. Therefore, the gap-fill FSG layer 106 easily absorbs moisture when the gap-fill FSG layer 106 is in contact with CMP slurry. The absorbed moisture and/or solvent certainly increases the dielectric constant of the IMD layer and can cause further problems when the IMD layer is exposed to a thermal process, such as an anneal process. After high temperature anneal processes, the moisture would be absorbed to result in a severe blister if the out gas is sealed in subsequent deposition processes.

Furthermore, fluorine is known as a reactive chemical species, as it can produce a rigorous chemical reaction to produce HF that is a more reactive intermediate. HF can result in metal corrosion, oxide degradation, peeling at the metal/IMD layer interface in subsequent processes when a metal plug is formed. Therefore, the FSG layers with high fluorine content can lead to an instability of processes, which degrades device reliability.

SUMMARY OF THE INVENTION

The invention provides a fabrication method for an inter-metal dielectric layer applicable to multi-level interconnects. A first liner layer is formed, followed by depositing a dielectric layer on the first liner layer. A second liner layer is then formed on the dielectric layer, while a cap layer is formed on the second liner layer. A planarization process is performed on the cap layer until the second liner layer is exposed.

As embodied and broadly described herein, the invention provides a fabrication method for an IMD layer applicable to a semiconductor process. A substrate is provided with a metal layer formed thereon. A gap-fill fluorinated silicon glass (FSG) layer is formed on the substrate and covers the metal layer. A FSG layer with low fluorine content is then formed on the gap-fill FSG layer, follows by forming a planarized oxide layer on the oxide cap layer. The method prevents a direct contact between the CMP slurry and the gap-fill FSG layer, to result in metal corrosion, peeling, as well as an increase of dielectric constant.

According to the present invention, an additional FSG layer with low fluorine content can be formed on the substrate prior to forming the gap-fill FSG layer. The FSG layer with low fluorine content can serve as a liner to provide a better adhesion between the gap-fill FSG layer and the metal layer, to prevent a metal corrosion, and to provide a lower dielectric constant than that of a conventional undoped silicon glass (USG) layer. Since the gap-fill FSG layer with higher fluorine content is protected by two FSG layers with low fluorine content, the surface of the gap-filled FSG layer is not exposed. As a result, this prevents the metal corrosion, degradation of the oxide, peeling issue at a metal/IMD interface.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
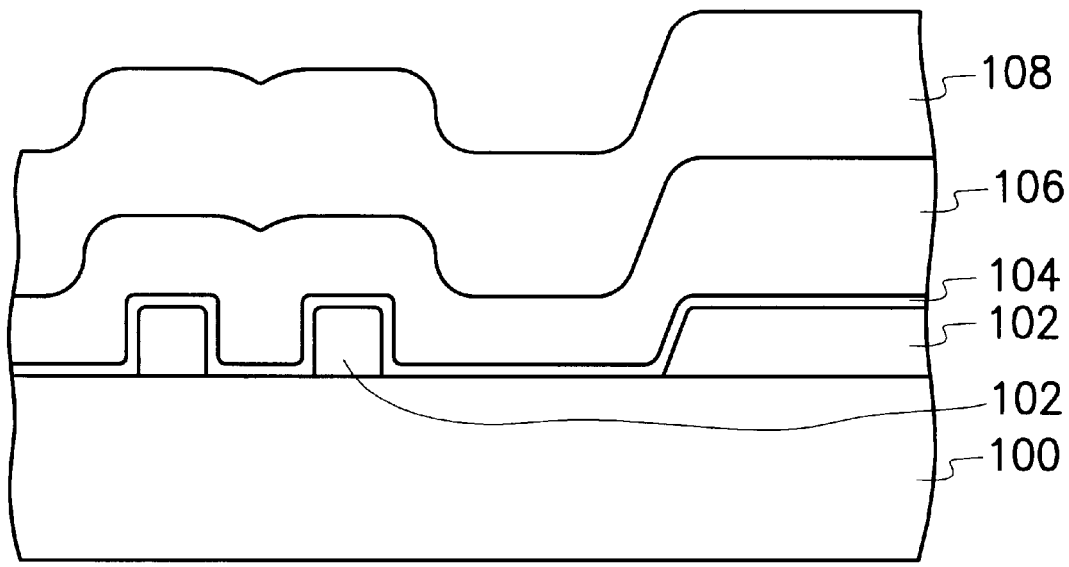
FIG. 1A and FIG. 1B are schematic, cross-sectional diagrams illustrating a conventional fabrication method for an IMD layer.
Figure 1B:
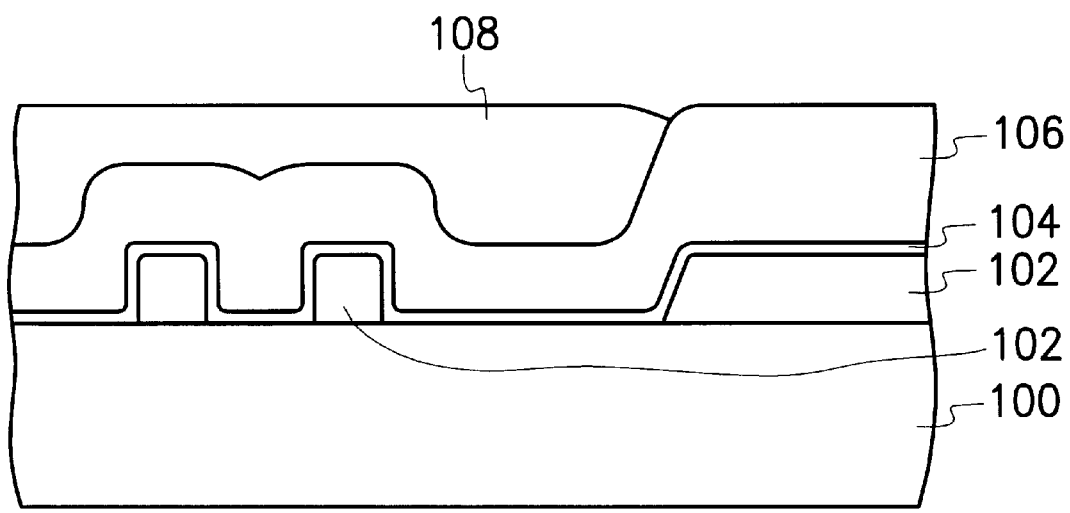
Figure 2A:
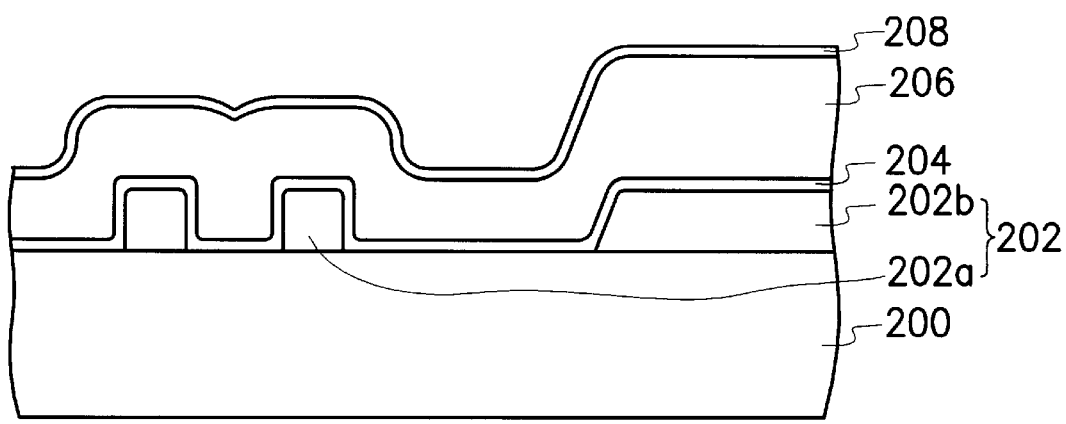
FIG. 2A through FIG. 2C are schematic, cross-sectional diagrams illustrating a fabrication method for an IMD layer according to one preferred embodiment of this invention.
Figure 2B:
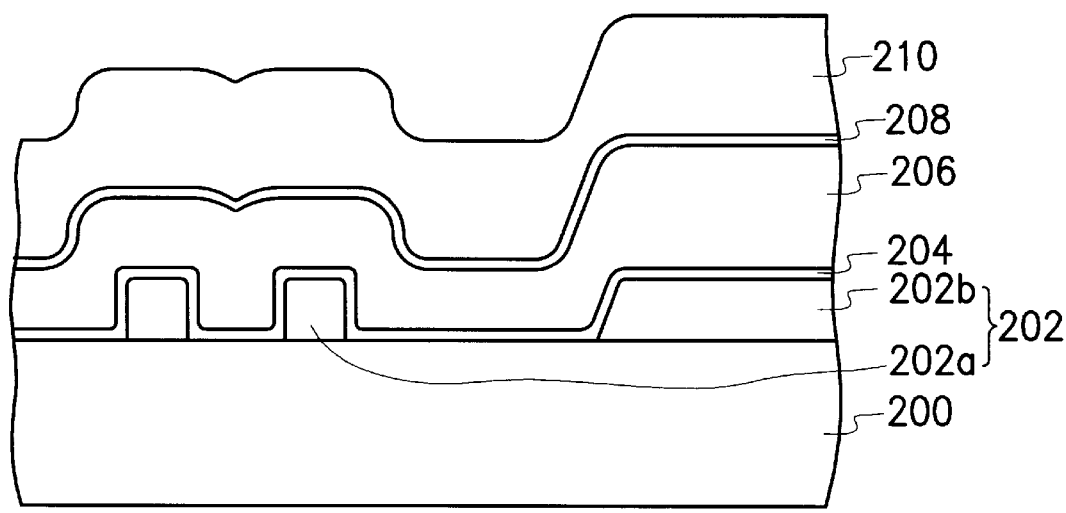
Figure 2C:
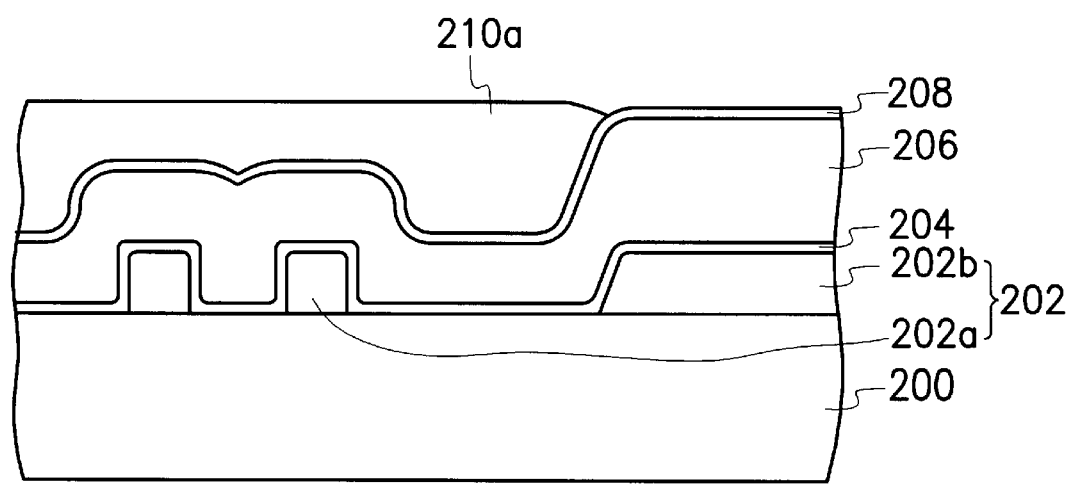
Figure 3:
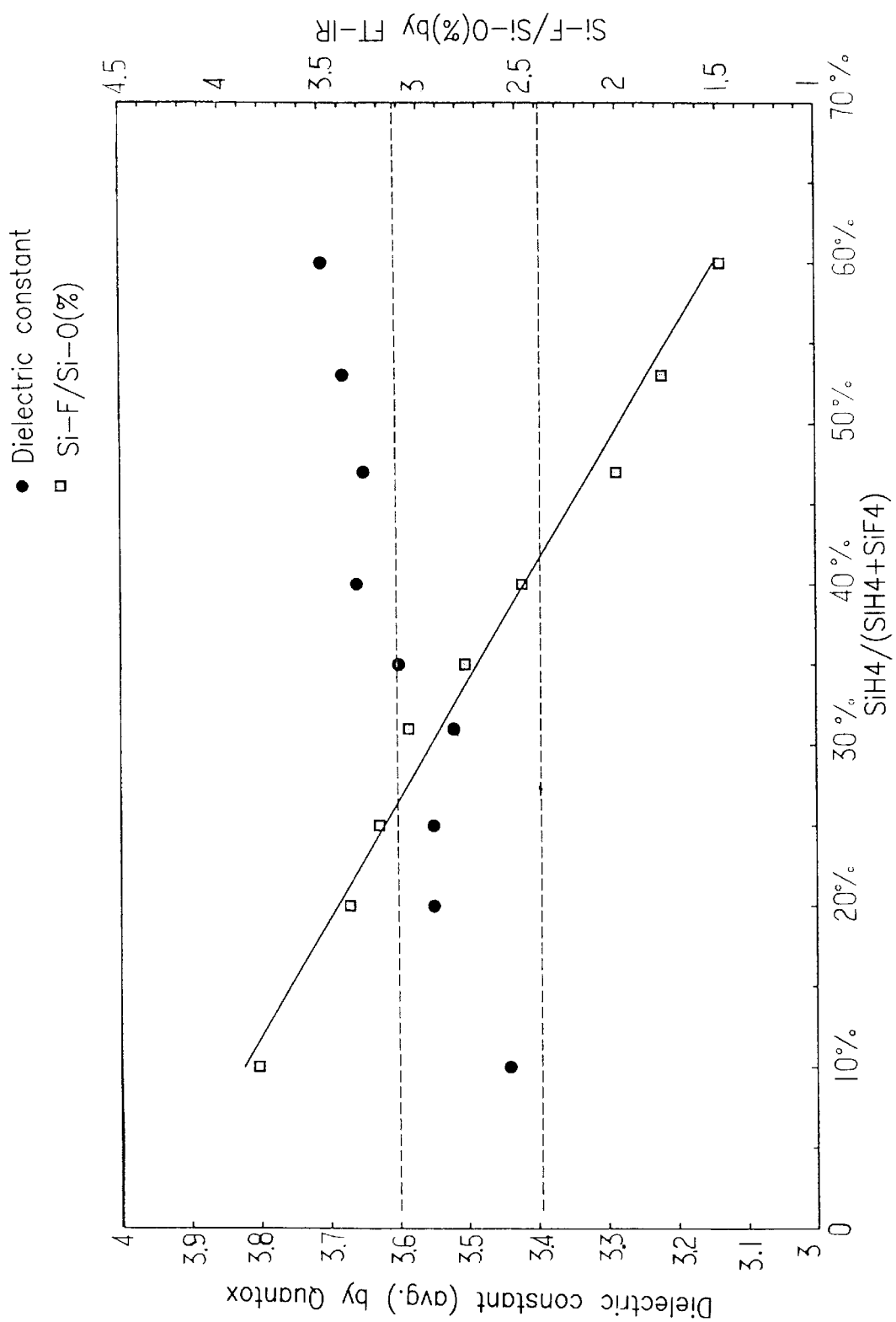
FIG. 3 is a graph showing a relationship between the fluorine content and the dielectric constant.

Description is made with reference to FIGS. 2A through 2C, while FIG. 3 is incorporated as an experimental result showing the relationship between the fluorine content and the dielectric constant.

Referring to FIG. 2A, a plurality of metal lines 202 are formed on a substrate 200. The metal lines 202 are distributed in a dense conductive line region 202a having a high-density distribution and a loose conductive line region 202b having a low-density distribution. A first liner layer 204 is formed on the substrate 200 to cover the metal lines 202 so as to prevent the metal lines 202 from corrosion, with improving an adhesion between the metal lines 202 and a dielectric layer 206 which is formed subsequently.

The first liner layer 204 is preferably made of fluorinated silicon glass (FSG) layer with a low fluorine content. The method for forming the first liner layer 204 includes high-density plasma chemical vapor deposition (HDPCVD), while the method uses a dopant source comprising $SiH_4$ and $SiF_4$, with a preferred fluorine content of about 4–7% of fluorine atoms in the dopant source. The first liner layer 204 is formed to have a thickness of about 500–1500 angstroms.

A dielectric layer 206 is formed on the first liner layer 204 and fills gaps between the metal lines 202. The dielectric layer 206 is preferably formed by HDPCVD and is made of a biased-clamped FSG layer with high gap-filled capability via simultaneously sputtering and deposition process.

Referring to FIG. 2B, a second liner layer 208 is formed on the dielectric layer 206. The second liner layer 208 is made of a FSG layer with low fluorine content. The second liner layer 208 in this case is made of the same material as that of the first liner layer 204, therefore they possess the same fluorine content of about 4–7% of fluorine atoms in a dopant mixture comprising $SiH_4$ and $SiF_4$. Also, the second liner layer 208 has a thickness of about 500–1500 angstroms. Since the liner layers 204 and 208 both possess a lower fluorine content than the dielectric 206, the liner layers 204 and 208 provide a relative chemical inertness in terms of fewer reactive fluorine atoms.

Furthermore, a cap layer 210 is formed on the second liner layer 208 to complete the fabrication of the IMD layer. The cap layer 210 can be made of any dielectric material having a low dielectric constant (k), but it is preferably made of oxide by plasma enhanced chemical vapor deposition (PECVD).

Referring to FIG. 2C, a chemical mechanical polishing (CMP) process is performed to planarize the cap layer 210 until a top surface of the cap layer 210 is level with the second liner layer 208. Since the second liner layer 208 exhibit a relatively weak hydrophilic behavior due to a low fluorine content, the second liner layer 208 isolates the CMP slurry from the dielectric layer 206. This eventually prevents a metal corrosion, peeling, as well as an increase of dielectric constant.

Since the first liner layer 204 and the second liner layer 208 are more inert due to a low content of fluorine atoms known to be reactive with metals and other elements, it imply that the liner layers 204 and 208 formed as such are chemically and thermally more stable. In addition, the first liner layer 204 also has a lower dielectric constant (about 3.7) as compared to the conventional USG layer (about 4.1).

Referring to FIG. 3, the illustrated experimental result shows that a dielectric constant of a FSG layer is related to a HF ratio (shown as $SiH_4/(SiH_4+SiF_4)\%$) in its dopant source. From the diagram, it is seen that the FSG layers in this case all have a low dielectric constant as compared to other conventional dielectric materials, while the fluorine content of the FSG layer is directly related to the HF ratio in its dopant source.

According to the present invention, the overall dielectric constant of the IMD layer remains low even though it includes the FSG layer with low fluorine content, since such FSG layer has a slightly higher dielectric constant (about 3.7) than that of the conventional FSG layer (about 3.5). Therefore, the dielectric constant of the IMD layer is not significantly affected, whereas the IMD layer formed as such is free from corrosion problems caused by fluorine atoms.

Summarizing the above, it is understood that a first liner layer with low fluorine content is formed on the substrate prior to forming the dielectric layer. The first liner layer with low fluorine content provides a better adhesion between the dielectric layer and the metal lines, while it prevents the metal lines from being corroded. Also, the first liner has a lower dielectric constant than that of a conventional USG layer. A second liner layer with low fluorine content is formed on the dielectric layer. This prevent a direct contact between the CMP slurry and the dielectric layer, which results formation of HF acid and metal corrosion, after CMP is performed to planarize the cap layer.

Since the biased-clamped FSG layer is protected between two FSG layers both with low fluorine content, the IMD layer as a whole exhibits a relative chemical inertness, said to be a very weak hydrophilic behavior. As a result, the present method prevents the metal corrosion, degradation of the oxide, peeling issue at a metal/IMD interface.

Although the method described above is embodied with reference to the multilevel interconnect process, the method are equally applicable to other processes such as formation of metal contact, dual damascene process, or deposition of a dielectric layer between the conductive lines or devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for an inter-metal dielectric layer which is applicable to multi-level interconnects, the method comprising:

providing a substrate with metal lined formed thereon;

forming a dielectric layer on the substrate, wherein a lower portion and an upper portion of the dielectric layer have a lower moisture and oxygen absorption capability compared to a middle portion of the dielectric layer;

forming a cap layer on the dielectric layer; and planarizing the cap layer until a top surface of the dielectric layer is exposed.

2. The fabrication method of claim 1, wherein the method of forming dielectric layer includes high-density plasma chemical vapor deposition (HDPCVD).

3. The fabrication method of claim 1, wherein the dielectric layer includes a FSG layer.

4. The fabrication method of claim 2, wherein the FSG layer is formed using a plasma gas including $Si_4H$ and $SiF_4$.

5. The fabrication method of claim 4, wherein the fluorine content in the plasma gas is increased during the deposition of the middle portion of the dielectric layer so that the fluorine content of the lower portion and the upper portion of the FSG layer is lower compared to the fluorine content in the middle portion of the FSG layer.

6. The fabrication method of claim 1, wherein the lower portion and the upper portion of the dielectric layer includes a fluorine content of about 4–7% of fluorine atoms.

7. The fabrication method of claim 1, wherein the lower portion and the upper portion of the dielectric layer has a thickness of about 500–1500 angstroms.

8. The fabrication method of claim 1, wherein the cap layer includes a silicon oxide layer.

9. The fabrication method of claim 1, wherein the the step of planarizing the cap layer includes chemical mechanical polishing (CMP).

10. A fabrication method for an inter-metal dielectric layer, the method comprising:
providing a substrate with conductive regions formed thereon, wherein the conductive regions comprises a dense conductive line region and a loose conductive line region;
forming a first FSG layer on the substrate;
forming a second FSG layer on the first FSG layer;
forming a third FSG layer on the second FSG layer, wherein a fluorine content of the second FSG layer is higher compared to the fluorine content of the first and third FSG layers; and
forming a planarized oxide cap on the third FSG layer, so that the third FSG layer is exposed.

11. The fabrication method of claim 10, wherein the method for forming the first FSG layer, the second FSG layer, and the third FSG layer includes HDPCVD.

12. The fabrication method of claim 11, wherein the first FSG layer has a fluorine content of about 4–7% of fluorine atoms.

13. The fabrication method of claim 11, wherein the first FSG layer has a thickness of about 500–1500 angstroms.

14. The fabrication method of claim 11, wherein the third FSG layer includes a fluorine content of about 4–7% of fluorine atoms.

15. The fabrication method of claim 11, wherein the third FSG layer has a thickness of about 500–1500 angstroms.

16. A fabrication method for an inter-metal dielectric layer, the method comprising:
providing a substrate with conductive regions formed thereon; and
forming a FSG layer on the substrate using a gas plasma containing fluorine, wherein the fluorine content in the plasma gas is increased during the deposition of a middle portion of the FSG layer so that the fluorine content of a lower portion and an upper portion of the FSG layer is lower compared to the fluorine content in the middle portion of the FSG layer.

17. The fabrication method of claim 16, wherein the method for forming the FSG layer includes HDPCVD.

18. The fabrication method of claim 16, wherein the lower portion and the upper portion of the FSG layer includes a fluorine content of about 4–7% of fluorine atoms.

19. The fabrication method of claim 16, wherein the lower portion and the upper portion of the FSG layer has a thickness of about 500–1500 angstroms.

* * * * *